US009869551B2

(12) United States Patent
Jeanroy

(10) Patent No.: US 9,869,551 B2
(45) Date of Patent: Jan. 16, 2018

(54) INERTIAL ANGULAR SENSOR OF BALANCED MEMS TYPE AND METHOD FOR BALANCING SUCH A SENSOR

(71) Applicant: SAGEM DEFENSE SECURITE, Boulogne, Billancourt (FR)

(72) Inventor: Alain Jeanroy, Boulogne Billancourt (FR)

(73) Assignee: Sagem Defense Securite, Boulogne-Billancourt (FR)

( * ) Notice: Subject to any disclaimer, the term of this patent is extended or adjusted under 35 U.S.C. 154(b) by 0 days.

(21) Appl. No.: 14/362,195

(22) PCT Filed: Dec. 3, 2012

(86) PCT No.: PCT/EP2012/074290
§ 371 (c)(1),
(2) Date: Jun. 2, 2014

(87) PCT Pub. No.: WO2013/083534
PCT Pub. Date: Jun. 13, 2013

(65) Prior Publication Data
US 2014/0299947 A1   Oct. 9, 2014

Related U.S. Application Data

(60) Provisional application No. 61/650,668, filed on May 23, 2012.

(30) Foreign Application Priority Data

Dec. 6, 2011   (FR) ...................................... 11 03733

(51) Int. Cl.
*G01C 19/574*   (2012.01)
*H01L 29/84*   (2006.01)
(Continued)

(52) U.S. Cl.
CPC .......... *G01C 19/574* (2013.01); *B81B 3/0021* (2013.01); *B81C 99/003* (2013.01); *B81C 99/0025* (2013.01); *B81C 99/0045* (2013.01)

(58) Field of Classification Search
CPC ... G01C 19/574; G01C 19/5747; H01L 29/82; H01L 29/84
See application file for complete search history.

(56) References Cited

U.S. PATENT DOCUMENTS 6,823,733 B2 * 11/2004 Ichinose ............ G01C 19/5719
73/504.02
2006/0032308 A1 * 2/2006 Acar .................. G01C 19/5719
73/504.12
(Continued)

FOREIGN PATENT DOCUMENTS

EP          2 063 223 A1    5/2009
WO       WO 92/14160 A1    8/1992
(Continued)

OTHER PUBLICATIONS

Sang Won Yoon, "Vibration Isolation and Shock Protection for MEMS," 2009, ProQuest, University of Michigan, Chapter 2, section 2.2, pp. 1-80.
(Continued)

*Primary Examiner* — Michele Fan
(74) *Attorney, Agent, or Firm* — Muncy, Geissler, Olds & Lowe, P.C.

(57) ABSTRACT

An inertial angular sensor of MEMS type has a support of at least two masses which are mounted movably with respect to the support, at least one electrostatic actuator and at least one electrostatic detector. The masses are suspended in a frame itself connected by suspension means to the support. The actuator and the detector are designed to respectively produce and detect a vibration of the masses, and a method for balancing such a sensor provided with at least one load
(Continued)

Figure 1:
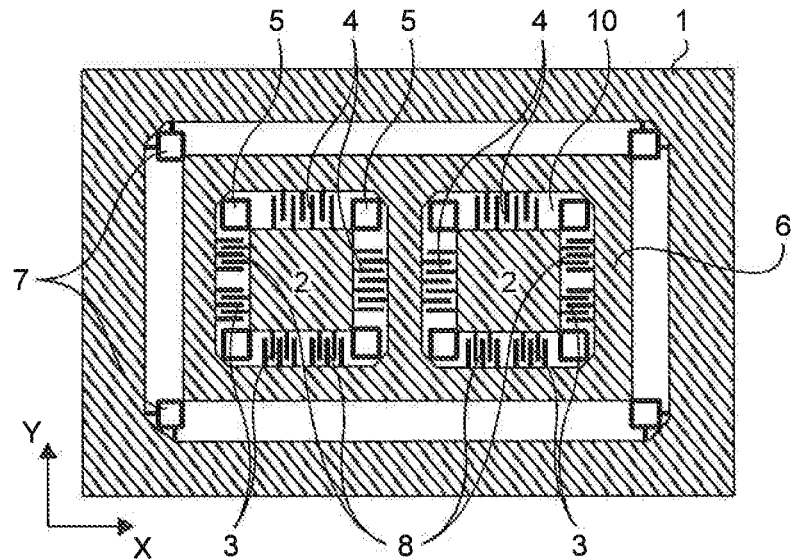

detector mounted between the frame and the support and with at least one electrostatic spring placed between the frame and one of the masses and slaved so as to ensure dynamic balancing of the sensor as a function of a measurement signal of the load sensor.

11 Claims, 3 Drawing Sheets

(51) Int. Cl.
*B81B 3/00* (2006.01)
*B81C 99/00* (2010.01)

(56) References Cited

U.S. PATENT DOCUMENTS

| | | | |
|---|---|---|---|
| 2007/0144254 A1* | 6/2007 | Handrich | G01C 19/5726 73/504.12 |
| 2007/0144255 A1* | 6/2007 | Handrich | G01C 19/5726 73/504.12 |
| 2008/0276706 A1 | 11/2008 | Hartmann et al. | |
| 2009/0090200 A1 | 4/2009 | Mita et al. | |
| 2009/0272189 A1* | 11/2009 | Acar | G01C 19/574 73/504.16 |
| 2009/0282916 A1* | 11/2009 | Modugno | G01C 19/5776 73/504.12 |
| 2010/0057224 A1* | 3/2010 | Rojo | G01P 15/131 700/37 |
| 2010/0236327 A1* | 9/2010 | Mao | G01C 19/5719 73/504.12 |
| 2010/0319451 A1* | 12/2010 | Trusov | G01C 19/5719 73/504.12 |
| 2011/0094301 A1* | 4/2011 | Rocchi | G01C 19/574 73/504.08 |
| 2011/0094302 A1* | 4/2011 | Schofield | G01C 19/56 73/504.12 |
| 2013/0042683 A1* | 2/2013 | Chaumet | G01C 19/5621 73/504.16 |
| 2013/0333470 A1* | 12/2013 | Netzer | G01C 19/5747 73/504.12 |

FOREIGN PATENT DOCUMENTS

| | | | | |
|---|---|---|---|---|
| WO | WO 2004/046646 A2 | 6/2004 | | |
| WO | WO 2011064016 A1 * | 6/2011 | | G01C 19/574 |

OTHER PUBLICATIONS

Schofield A. R. et al., "Anti-Phase Driven Rate Gyroscope with Multi-Degree of Freedom Sense Mode," Solid-State Sensors, Actuators and Microsystems Conference, 2007, Transducers 2007, International IEEE, Piscataway, NJ Jun. 10, 2007, pp. 1199-1202.
Trusov et al., "Gyroscope architecture with structurally forced anti-phase drive-mode and linearly coupled anti-phase sense-mode," Solid-State Sensors, Actuators and Microsystems Conference, 2009, Transducers 2009, International IEEE, Piscataway, NJ Jun. 21, 2009.

* cited by examiner

INERTIAL ANGULAR SENSOR OF BALANCED MEMS TYPE AND METHOD FOR BALANCING SUCH A SENSOR

The present invention relates to a vibrating inertial angular sensor such as a gyrometer or a gyroscope and a method for balancing this sensor.

The invention relates more precisely to micro-electromechanical sensors also termed MEMS for "micro-electromechanical system". These sensors are produced by collective etching on a material wafer of very small thickness: they are small, lightweight and relatively inexpensive, thus enabling them to be employed in numerous fields of application, both in specialized technical products and also in mass-market products.

The fields of application of these sensors include the inertial measurement of angles (free gyro) and angular speeds (rate gyro).

Vibrating angular inertial sensors of MEMS type are classed into two families according to the definition of the resonator. The resonator may be a deformable body, generally axisymmetric: annulus, cylinder, hemisphere, disc. The resonator can also consist of one or more non-deformable masses connected to a support by elastic elements. Each sensor comprises actuators designed to set the deformable resonator or the mass/elastic elements system into vibration at the resonant frequency of the system and detectors of the deformations of the deformable resonator or motions of the mass/elastic elements system are mounted between the deformable resonator or the mass/elastic elements system and the support.

The performance of any vibrating inertial sensor stems directly from the stability of the anisotropy of damping of the resonator. This stability is conditioned by:
  the time constant $\tau$ (equal to the mechanical over-tension Q divided by $\pi$ and by the frequency f i.e. $\tau = Q/(\pi, f)$) of the resonator which governs the quantity of energy that it will be necessary to expend to keep the resonator at resonance,
  the dynamic balancing of the resonator so as, on the one hand, to limit outward losses of energy from the sensor and, on the other hand, to limit, the disturbances of the vibration of the resonator through the vibratory environment of the sensor at the operating frequency.

In the field of vibrating sensors of MEMS type, this is manifested through:
  the use of silicon as material to obtain a relatively high over-tension,
  the presence of at least two masses mounted symmetrically in such a way that the masses move in phase opposition, thus affording balancing to first order.

The highest-performance vibrating angular inertial sensors of MEMS type thus have four masses disposed according to a square pattern.

The improvement in the performance of these sensors is, however, limited by the defects of production of the sensors.

These production defects give rise to a dynamic unbalance resulting from the displacement of the global centre of gravity of the masses at the vibration frequency. This dynamic unbalance causes reaction forces in the support and therefore a loss of energy of the vibration. This is all the more troublesome as the small size of the sensors increases the impact of the production defects on the precision of the measurements. Indeed, for MEMS, the ratio [production defect/characteristic dimensions] is degraded with respect to a macroscopic sensor. This leads to a higher dynamic unbalance in relation to the mass of the resonator.

The consequence of the small mass of the resonator is that it makes it difficult to measure the defects of dynamic balancing since the loads to which the unbalance gives rise are too small for it to be possible to measure them. Furthermore, even if one were to succeed in performing this measurement, it would be difficult to correct the unbalance by locally removing or adding material because of the small size of the sensor. Such a correction by removing or adding material would furthermore exhibit the drawback that it would not make it possible to compensate for the change in the unbalance as a function of temperature and time.

It is customary to rigidly fix an unbalanced resonator to a sizable recoil mass at the price of increased sensitivity to vibrations and lesser mechanical resilience.

In the case of resonators with several masses, this results furthermore in an independence of the proof masses. The mechanical coupling allowing first-order compensation of the displacements of the masses is then ensured by levers interconnecting the masses so as to constrain them to a displacement in phase opposition, The production of the sensor is then complex and expensive. Furthermore, balancing is rendered difficult by the proliferation of the degrees of freedom resulting from the number of masses and the number of coupling levers between the masses which entail an influence on the other masses of any balancing correction performed on one of the masses. For the same reasons, electronic balancing by means of a correction algorithm is complex to carry out.

The invention results from a different approach, the object of which is to improve vibrating angular inertial sensors of MEMS type.

For this purpose, there is provided, according to the invention, a vibrating inertial angular sensor of MEMS type comprising a support, at least two masses suspended in a frame mounted movably with respect to the support by suspension means, at least one electrostatic actuator and at least one electrostatic detector. This actuator and this detector are designed to respectively produce and detect a vibration of the masses.

Thus, the direct mechanical coupling by levers between the masses is eliminated. Indeed, the mechanical coupling between the masses is ensured in the invention by the suspended frame, thereby simplifying the structure of the sensor. The actuator and the detector are for example each mounted between one of the masses and the frame and operate as before.

Preferably, at least one load sensor is mounted between the frame and the support and at least one electrostatic spring is mounted between the frame and one of the masses and is slaved so as to ensure dynamic balancing of the sensor as a function of a measurement signal of the load sensor.

The balancing may be obtained with this structure by measuring the anisotropy (or discrepancy) in frequency between the two mass/suspension systems and by eliminating this anisotropy. The measurement of the anisotropy may be performed in an indirect manner by measuring the effect of the unbalance created by the frequency anisotropy. The balancing correction is performed preferably by controlling the electrostatic spring so as to add a negative electrostatic stiffness to the stiffness of the mass/suspension system possessing the highest frequency in such a way as to correct the intrinsic discrepancy in angular frequency due to production defects and to temporal and thermal changes in the parameters of each of the mass/suspension systems. The adjustment, based on zero slaving, does not require any accurate reference tension or stable gains at the level, of the sensor processing electronics.

The subject of the invention is also a method for balancing this sensor.

Other characteristics and advantages of the invention will emerge on reading the description which follows of non-limiting particular embodiments of the invention.

Figure 2:
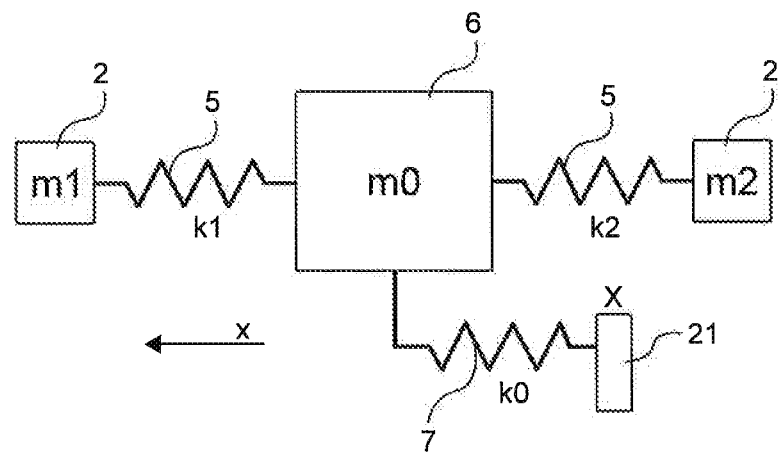
Figure 3:
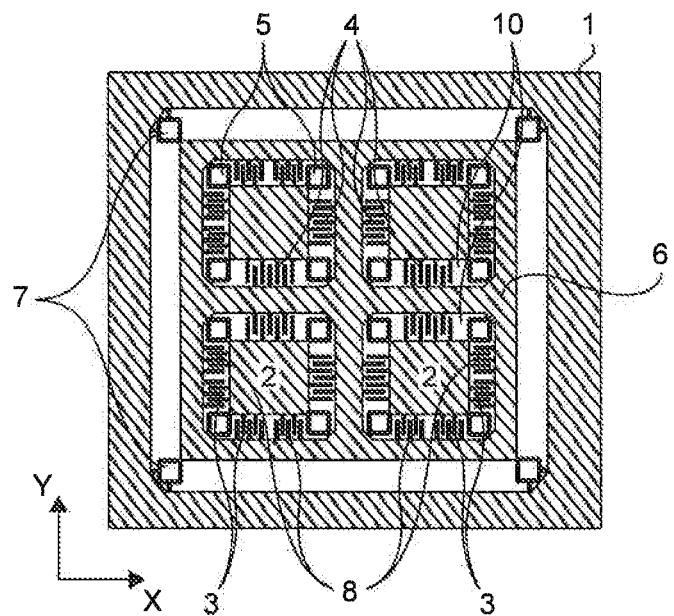
Figure 4:
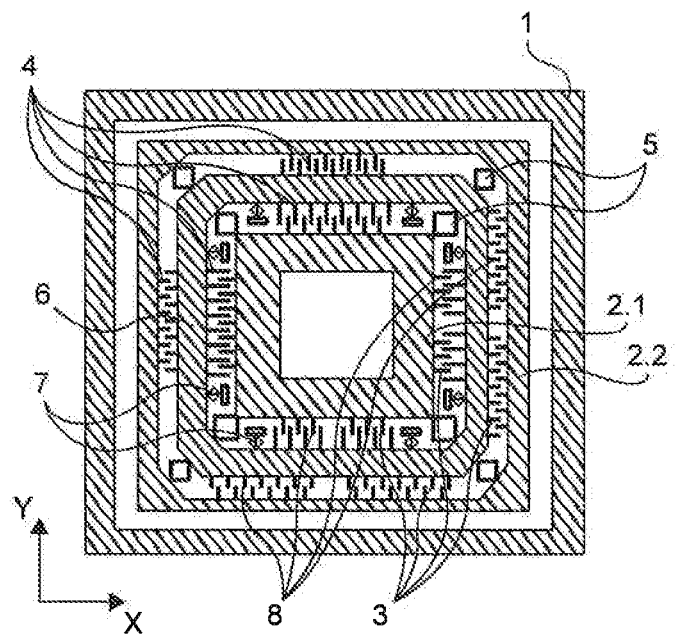
Figure 5:
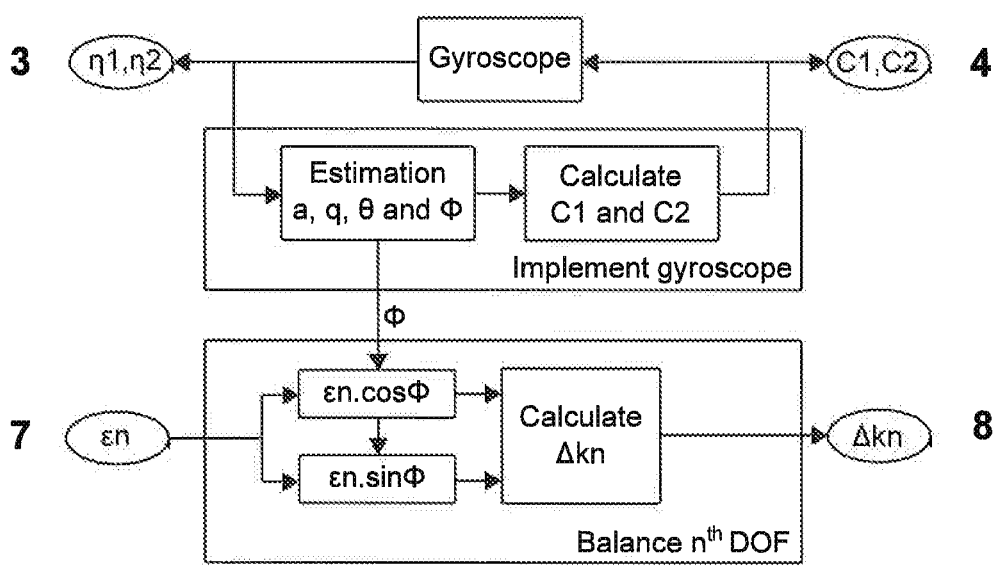
Figure 5:
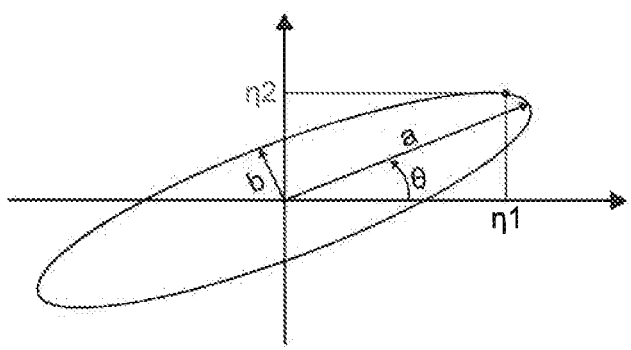

Reference will be made to the appended drawings, among which:

FIG. 1 is a schematic view of a first embodiment of the sensor of the invention, FIG. 2 is a schematic view illustrating the operating principle of this sensor, FIG. 3 is a schematic view of a second embodiment of the sensor of the invention, FIG. 4 is a schematic view of a third embodiment of the sensor of the invention, FIG. 5 is a schematic view of an embodiment of a control unit for the sensor of the invention.

With reference to the figures, the invention relates to a vibrating inertial angular sensor of MEMS type intended to form a free gyro or a rate gyro.

The sensor of the invention comprises a support 1 and at least two masses 2 which are mounted movably with respect to the support 1 and which are associated with electrostatic actuators 3 and with electrostatic detectors 4.

The masses 2 are suspended via suspension means 5 in a frame 6 itself connected to the support 1 by suspension means 7. The suspension means 5 and 7 are isotropic in the XY plane defining the plane of suspension of the masses of the sensor and are produced so as to exhibit sizable stiffness along the axis normal to the plane of the sensor so as to eliminate the degrees of freedom of the masses 2 and of the frame 6 outside of the plane. Each mass 2 and the frame 6 have three degrees of freedom in the plane, namely two translations (along the X and Y axes) and a rotation (about an axis normal to this X and Y plane).

For each of the X and Y axes, an actuator 3 and a detector 4 are mounted between each of the masses 2 and the frame 6. The actuators 3 and the detectors 4 have a known structure in the form of comb electrodes whose teeth are mutually intercalated. The combs of the actuators 3 and of the detectors 4 can have a mode of operation with variable gap or with variable surface area.

The masses 2 are identical and of square shape on the sides of which are disposed the actuators 3 and the detectors 4. The suspension means 5 are disposed at the vertices of each mass 2.

Two electrostatic springs 8 are mounted between the frame 6 and each of the masses 2 so as to act respectively along the X and Y axes. The electrostatic springs 8 have a known structure in the form of comb electrodes whose teeth are mutually intercalated. The combs of the electrostatic springs 8 have a mode of operation with variable gap.

Unbalance effect detectors, here more particularly force sensors, are integrated into the suspension means 7 so as to provide a measurement signal representative of the loads transmitted to the support 1 by the frame 6. These sensors are known per se and may be piezoresistive or piezoelectric strain gauges.

The fabrication of the sensor of the invention is carried out on the basis of conventional techniques for etching wafers of semi-conductor material. The semi-conductor material used here is silicon.

The actuators 3 and the detectors 4 are connected, by electrical conductors known per se, to a control unit 9, likewise known per se, which is programmed to control the actuators 3 and process the signals of the detectors 4 so as to ensure the detection of angular magnitude about an axis normal to the plane of displacement of the masses 2.

The electrostatic spring 8 and the force sensors integrated into the suspension means 7 are likewise connected to the control unit 9 which is programmed to slave the electrostatic springs 8 as a function of the signals of the said force sensors demodulated as a function of the vibration frequency of the masses 2 so as to eliminate the unbalance at the vibration frequency in such a way as to ensure balancing of the sensor.

The operation of the control unit is represented in FIG. 5 in the determination of the stiffness variation $\Delta kn$ for the balancing of the sensor according to a degree of freedom "n". Symbolized therein is an elliptical vibration of major axis "a" and of minor axis "b". The major axis of the vibration forms an angle $\theta$ in an XY coordinate system. The implementation of the gyroscope leads to the determination of the controls C1 and C2 of the actuators 3 as a function of the motions $\eta 1$, $\eta 2$ detected by the sensors 4. Knowing that the values $\eta 1 = a \cdot \cos \theta \cos \varphi + q \cdot \sin \theta \sin \varphi$ and $\eta 2 = a \cdot \sin \theta \sin \varphi + q \cdot \cos \theta \cos \varphi$, an estimation of a, q, $\theta$ and $\varphi$ is deduced therefrom. Knowing the loads $\xi n$ detected by the sensors 7, the control unit calculates the values $\xi n \cdot \cos \varphi$ and $\xi n \cdot \sin \varphi$ so as to arrive at the stiffness variation $\Delta kn$ serving as set-point to drive the electrostatic springs 8.

In the embodiment of FIGS. 1 and 2, the masses 2 are two in number and are mounted side by side within the frame 6. The frame 6 is of rectangular shape and comprises two adjacent housings 10 which each receive one of the two masses 2.

With reference more particularly to FIG. 2, the sensor according to the first embodiment can be regarded as two mass/spring systems $(m_1, k_1)$ and $(m_2, k_2)$ connected to the outside world by another mass/spring system $(m_0, k_0)$.

The behaviour of the sensor can be modelled on the basis of the following data (a mass discrepancy and a stiffness discrepancy are denoted $\delta m$ and $\delta k$ respectively):

$$m1 := m \cdot (1+\delta m); m2 := m \cdot (1-\delta m);$$

$$k1 := k \cdot (1+\delta k); k2 := k \cdot (1-\delta k);$$

$$m0 := \beta \cdot m; k0 := \alpha \cdot k;$$

$$k := \omega^2 \cdot m;$$

The modelling makes it possible to calculate the frequencies of the natural modes, the unbalance of the useful natural mode and the reaction force of this unbalance on the support.

It follows from this that the unbalance is proportional to the mass m, to the ratio $k_0/k$ denoted $\alpha$ and to the discrepancy in angular frequencies $\delta \omega$ of the two mass spring systems. The unbalance of the useful mode thus equals:

$$\text{unbalance} = 2m\alpha\delta\omega$$

The load transmitted to the outside world can be expressed in a similar manner:

$$\text{load} = 2k\alpha\delta\omega$$

It emerges from the above formulae that the particular architecture of the invention makes it possible to cancel the unbalance by cancelling the discrepancy in angular frequency between the two mass spring systems, which discrepancy is observable on the basis of the measurement of the load on the frame. A balancing of the sensor can therefore be carried out, in accordance with the invention, on the basis of the following steps:

measuring an anisotropy in frequency between the masses, the measurement step being carried out by measuring the load applied by the frame to the support on account of the unbalance of the sensor resulting from production defects, correcting the anisotropy in frequency between the masses.

The correction step is carried out by controlling the electrostatic springs 8 in such a way as to reduce this effect: a slaving utilizing the demodulation with respect to the frequency of the vibration of the signals of the force sensors incorporated into the suspension means 7 corrects the stiffnesses of the electrostatic springs 8 placed between the masses 2 and the frame 6 so as to eliminate the unbalance at the frequency of the vibration.

The correction is performed here more precisely by adding a negative electrostatic stiffness to the stiffness of the mass/spring system possessing the highest frequency so as to correct the intrinsic discrepancy in angular frequency due to production defects and to temporal and thermal changes in the parameters of each of the mass/spring systems.

It will be noted that the arrangement of the sensor makes it possible to obtain two natural modes along the X axis, namely masses $m_1$ and $m_2$ displacing in phase and masses $m_1$ and $m_2$ displacing in phase opposition, with a small displacement of the mass $m_0$, which do not have the same frequencies. The frequency discrepancy is for example of the order of 10% if $m_0=10*m_{1/2}$ or 25% if $m_0=4*m_{1/2}$. This confirms the possibility of simplifying the structure, by riot using any mechanical coupling levers between the masses, without any risk of interlinking of the two natural modes during operation.

It is thus possible to fabricate a closed-loop gyrometer having 2 vibrating masses with a slaving to 0 of the motion on the Coriolis pathway Y. This makes it possible to use a natural mode that is unbalanced to first order for this pathway.

In the embodiment of FIG. 3, the masses 2 are four in number disposed according to a square pattern and an electrostatic spring 8 is placed between the frame 6 and each of the four masses 2, for each of the X and Y axes. The frame 6 is of square shape and comprises four adjacent housings 10 which each receive one of the masses 2.

In this embodiment, the sensor is also balanced to first order on the Y axis on account of the arrangement with four masses. This sensor can therefore be used in gyroscope mode and profit from the intrinsic advantage of this mode, namely the stability of the mean drift.

In the embodiment of FIG. 4, the masses 2.1, 2.2 are two in number and are designed to be able to be mounted concentrically. The frame 6 is of square shape and the masses 2.1, 2.2 of square annular shape are placed on either side of the frame 6.

The masses 2.1, 2,2 therefore have frame shapes with merged axes of symmetry possessing identical natural frequencies. Preferably, the masses of the frames 2.1, 2.2 are identical and the means for suspending the masses 2.1, 2.2 have identical stiffnesses. This makes it possible to comply with the assumptions of the dynamic-modelling equations presented above.

Of course, the invention is not limited to the embodiments described but encompasses any variant entering the field of the invention such as defined by the claims.

It is possible to have electrostatic springs slaved to all the masses 2 or to all the masses 2 except one.

The effect of the unbalance measured may be a load applied by the frame 6 to the support 1, an acceleration of the frame 6 with respect to the support 1, a speed of the frame 6 with respect to the support 1, a displacement of the frame 6 with respect to the support 1 or other.

The sensor can have a different shape from that described. The masses and the frame can have, in the plane of the sensor, polygonal or at least partially curved shapes, that may be described by four 90° rotations of a pattern representing a quarter of the geometry.

The actuator and the detector may be mounted between one of the masses and the frame or between one of the masses and the support.

At least one electrostatic actuator and at least one electrostatic detector may be placed between the frame 6 and the support 1 so as to achieve active damping, known per se, of the suspension 7 of the frame 6.

The invention also relates to a sensor whose masses would be suspended in a frame and which would be devoid of the active balancing means described in conjunction with the embodiment represented in the figures.

The invention claimed is:

1. A vibrating inertial angular sensor of MEMS type comprising a support of at least two masses which are mounted movably with respect to the support, and at least one electrostatic actuator and at least one electrostatic detector which are designed to respectively produce and detect a vibration of the masses, wherein the sensor comprises a frame connected by first suspension means to the support and each mass is directly connected to the frame by second suspension means, so that each of the masses has only three degrees of freedom in a plane, and the frame has only three degrees of freedom in the plane.

2. The sensor according to claim 1, in which the masses are two in number.

3. The sensor according to claim 2, in which the masses are designed to be able to be mounted concentrically on either side of the frame.

4. The sensor according to claim 2, in which at least one electrostatic spring is mounted between the frame and at least one of the masses, for each of the two axes defining a plane of suspension of the masses, the electrostatic springs are four in number and are each mounted between the frame and each of the masses.

5. The sensor according to claim 1, in which at least one unbalance effect detector is mounted between the frame and the support and at least one electrostatic spring is placed between the frame and one of the masses and is slaved so as to ensure dynamic balancing of the sensor as a function of a measurement signal of the unbalance effect detector.

6. The sensor according to claim 1, in which the electrostatic actuator and the electrostatic detector are each mounted between one of the masses and the frame.

7. A method for balancing a sensor, the sensor comprising a support of at least two masses which are mounted movably with respect to the support, and at least one electrostatic actuator and at least one electrostatic detector which are designed to respectively produce and detect a vibration of the masses, wherein the sensor comprises a frame connected by first suspension means to the support and each mass is directly connected to the frame by second suspension means, so that each of the masses has only three degrees of freedom in a plane and the frame has only three degrees of freedom in the plane, and in which at least one unbalance effect detector is mounted between the frame and the support and at least one electrostatic spring is placed between the frame and one of the masses and is slaved so as to ensure dynamic balancing of the sensor as a function of a measurement signal of the unbalance effect detector, the method comprising: the steps of measuring and of correcting an anisotropy in frequency between the masses due to production defects, the measurement step being carried out by measuring an effect produced by an unbalance of the sensor resulting from the frequency anisotropy and the correction step being carried out by slaving the control of the electrostatic spring so as to reduce this effect.

8. The method according to claim 7, in which the effect of the unbalance measured is a load applied by the frame to the support.

9. The method according to claim 7, in which the effect of the unbalance measured is an acceleration of the frame with respect to the support.

10. The method according to claim 7, in which the effect of the unbalance measured is a speed of the frame with respect to the support.

11. The method according to claim 7, in which the effect of the unbalance measured is a displacement of the frame with respect to the support.

* * * * *